United States Patent
Giard

(10) Patent No.: US 8,116,413 B2
(45) Date of Patent: Feb. 14, 2012

(54) SIGNAL LEVEL ADJUSTER WITH INCREMENTAL GAIN ADJUSTMENTS, FOR RF COMMUNICATION EQUIPMENT

(75) Inventor: Olivier Giard, Caen (FR)

(73) Assignee: NXP B.V., Eindhoven (NL)

( * ) Notice: Subject to any disclaimer, the term of this patent is extended or adjusted under 35 U.S.C. 154(b) by 413 days.

(21) Appl. No.: 11/993,620

(22) PCT Filed: Jun. 22, 2006

(86) PCT No.: PCT/IB2006/052030
§ 371 (c)(1),
(2), (4) Date: May 17, 2010

(87) PCT Pub. No.: WO2007/000694
PCT Pub. Date: Jan. 4, 2007

(65) Prior Publication Data
US 2010/0316173 A1 Dec. 16, 2010

(30) Foreign Application Priority Data

Jun. 28, 2005 (EP) .................................... 05300523

(51) Int. Cl.
*H04L 27/08* (2006.01)
(52) U.S. Cl. ......... 375/345; 375/230; 375/233; 375/297
(58) Field of Classification Search .................. 375/345, 375/230, 233, 297
See application file for complete search history.

(56) References Cited

U.S. PATENT DOCUMENTS

| 5,659,582 | A | 8/1997 | Kojima et al. | |
|---|---|---|---|---|
| 6,324,229 | B1 | 11/2001 | Browder | |
| 2002/0131533 | A1 | 9/2002 | Koizumi | |
| 2003/0026364 | A1* | 2/2003 | Adachi | 375/345 |
| 2003/0128303 | A1* | 7/2003 | Masuda | 348/731 |
| 2003/0194029 | A1* | 10/2003 | Heinonen et al. | 375/345 |
| 2004/0037377 | A1 | 2/2004 | Brobston et al. | |
| 2004/0153879 | A1* | 8/2004 | Fukutani et al. | 714/48 |

FOREIGN PATENT DOCUMENTS

| EP | 0369135 A2 | 5/1990 |
|---|---|---|
| WO | 2004112384 A2 | 12/2004 |

* cited by examiner

*Primary Examiner* — Kabir A Timory

(57) ABSTRACT

A signal level adjusting device (AD), for RF communication equipment arranged to received primary RF signals, comprises i) a tuner (TU) comprising a gain control means (SI,R), arranged to define a first or second digital command signal respectively each time it receives a first or second digital control signal respectively, and a gain adjusting means (VGA) arranged to decrease or increase respectively its gain by a fixed value when the command signal defined by the gain control means (SI,R) is a first or second command signal respectively, in order to adjust the level of the received primary RF signals, and ii) a demodulator (DEM) comprising a level control means (LCM1) arranged to generate a first or second digital control signal respectively each time it detects an increase or decrease respectively of the level of secondary signals representative of the adjusted signals output by the tuner (TU).

6 Claims, 2 Drawing Sheets

SIGNAL LEVEL ADJUSTER WITH INCREMENTAL GAIN ADJUSTMENTS, FOR RF COMMUNICATION EQUIPMENT

FIELD OF THE INVENTION

The present invention relates to the domain of communication equipment, and more precisely to the control of the radiofrequency (RF) signal level in the receiver circuit or transceiver of communication equipment.

By "communication equipment" is meant here any equipment, mobile or not, adapted to establish radio communications and/or receive analog or digital television (TV) signals, and notably a mobile phone (for instance a GSM/GPRS, UMTS or WiMax mobile phone), a personal digital assistant (PDA), a laptop, a base station (for instance a Node B or a BTS), or more generally an RF communication module.

BACKGROUND OF THE INVENTION

As is known by one skilled in the art, the level of the (primary) RF signals that are received by communication equipment varies, which induces variations of its decoder performances. In order to restrict these variations a piece of communication equipment comprises a signal level adjusting device (or adjuster) comprising a tuner arranged to adjust its (voltage) gain in accordance with control signals to adjust the level of the primary RF signals received by the communication equipment antenna and a demodulator arranged to generate the control signals from secondary signals representative of the adjusted signals output by the tuner.

In the first generation of adjusters the control signal was a continuous voltage applied to a dedicated pin of an analog variable gain amplifier or attenuator (or the like). This control voltage (usually called "AGC (Automatic Gain Control) control voltage") generally varies between 0 volt and Vcc. This analog gain control offers good results as long as the dynamic range of the gain variations remains narrow, which is rarely the case. Moreover, analog gain control is sensitive to numerous parameters, such as temperature variations, device characteristic variations or signal modulation characteristics.

In order to overcome these drawbacks, a new generation of tuners with a digital adjuster gain control has been proposed. In this new generation of tuners the gain control may be finely driven by a word of at least 8 bits, for instance. This can be done through a bus. But the bus is sensitive to crosstalk with the transmitted RF signals and its use requires a complex protocol between the channel decoder and the micro-controller of the communication equipment. It is also possible to use an analog-to-digital converter (ADC) to convert the AGC control voltage into a digital gain control signal. But this is at the expense of size when the number of bits of the digital gain control is greater than or equal to 8 bits, which is necessary for a fine gain tuning (or adjustment). Detailed examples of the new tuner generation are notably described in the patent documents U.S. Pat. No. 6,324,229 and US 2004/0037377.

SUMMARY OF THE INVENTION

The object of the present invention is to improve the situation.

For this purpose, it provides a signal level adjusting device (or adjuster), for RF communication equipment arranged to receive primary RF signals, and comprising a tuner arranged to adjust its gain in accordance with control signals in order to adjust the level of the received primary RF signals and a demodulator arranged to generate the control signals from secondary signals representative of the adjusted signals output by the tuner.

This adjuster is characterized in that:
- its demodulator comprises a level control means arranged to generate a first or second digital control signal respectively each time it detects an increase or decrease of the level of the secondary signals respectively, and
- its tuner comprises i) a gain control means arranged to define a first or second digital command signal respectively each time it receives a first or second digital control signal respectively from the demodulator, and ii) a gain adjusting means arranged to decrease or increase respectively its gain by a fixed value when the command signal defined by the gain control means is a first or second command signal respectively.

In other words the invention proposes to use the AGC control line between the demodulator and the tuner to transmit very simple control signals, which indicate to the tuner if it has to increase or decrease its gain by a fixed value, or else to keep its gain constant.

The adjuster according to the invention may include additional characteristics considered separately or combined, and notably:
- its level control means may be arranged to generate a first or second digital control signal respectively each time it detects an increase or decrease respectively of the level of the secondary signals, greater than a chosen threshold;
- it may comprise an impedance means arranged to define a fixed high impedance value at the input of its gain control means. In this case its gain control means may be arranged to stop defining a command control when the impedance value at its input is equal to the fixed high impedance value;
  - for instance this impedance means may comprise two identical resistors mounted in parallel;
- it may comprise a multi-state buffer having a first and a second input and one output coupled to the input of the gain control means. In this case, the level control means may have a first output intended for delivering enable/disable signals for the first buffer input and a second output intended for delivering the first and second control signals synchronized with a clock for the second buffer input, and the buffer output either leaving the impedance value at the input of the gain control means at a chosen high value when the first output of the level control module feeds its first input with a first enable/disable value, or delivering the first or second control signal when the first output of the level control module feeds its first input with a second enable/disable value;
- its gain adjusting means may be a variable gain amplifier or attenuator,
- its gain control means may comprise i) a processing means arranged to generate a first or second register command respectively, when it receives a first or second digital control signal respectively from the demodulator, and ii) a register adapted to store an n-bit word (whose value constitutes the command signal) and to decrease or increase respectively the value of this word by a chosen increment representative of the fixed gain value when it receives a first or second register command respectively from the process means;
  - the gain adjusting means may be arranged to read the value of the word stored in the register and to fixed its gain depending on this value;

the gain control means may comprise a working control means coupled to the register and arranged to force this register to store a chosen word value for test purposes and/or to read the value of the word stored in the register for control purposes;

it may constitute at least part of an integrated circuit (IC).

The invention also provides a transceiver for RF communication equipment, comprising a transmitter circuit and a receiver circuit provided with an adjuster such as the one introduced above.

The invention further provides a RF receiver circuit comprising an adjuster such as the one above introduced.

BRIEF DESCRIPTION OF THE DRAWINGS

Other features and advantages of the invention will become apparent on examining the detailed specifications hereafter and the appended drawings, wherein.

The appended drawings may not only serve to complete the invention, but also to contribute to its definition, if need be.

DESCRIPTION OF PREFERRED EMBODIMENTS

Figure 1:
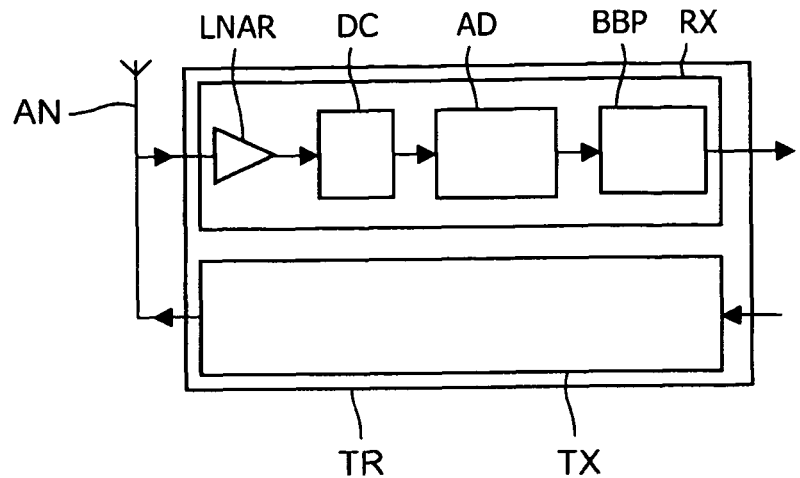
FIG. 1 schematically illustrates an example of embodiment of a transceiver for RF communication equipment, FIG. 2 schematically illustrates an example of embodiment of a signal level adjusting device (or adjuster) according to the invention, and FIG. 3 schematically illustrates four superposed time diagrams representative (starting from the upper part) of an example of four successive control signals and corresponding down command signals, up command signals and register values respectively.

Reference is initially made to FIG. 1 to briefly describe a transceiver TR in which the invention may be applied.

In the following description it will be considered that the transceiver TR is intended for RF communication equipment such as a mobile phone, for instance a GSM/GPRS or UMTS or else WiMax mobile phone. But it is important to notice that the invention is not limited to this type of RF communication equipment.

Indeed the invention may apply to any RF communication equipment, mobile or not, and notably to a personal digital assistant (PDA), a laptop, a base station (for instance a Node B or a BTS) of a mobile network, and more generally to any RF communication module adapted to establish radio communications and/or to receive analog or digital television (TV) signals.

As illustrated in FIG. 1, a transceiver TR comprises a transmitter (circuit) Tx and a receiver (circuit) RX both driven by a local oscillator signal and connected to an antenna AN adapted to receive and transmit RF signals.

The invention concerning only the receiver (circuit) RX, the transmitter (circuit) Tx will not be described hereafter.

In the illustrated (and non limiting) example, the receiver Rx comprises:
- a low-noise amplifier LNA receiving (primary) RF signals from the antenna AN and outputting amplified signals,
- an RF down-converter DC arranged to down-convert the frequency of the amplified RF signals (output by the low-noise amplifier LNA) to an intermediate frequency,
- a signal level adjusting device (or adjuster) AD arranged to filter in the baseband the analog signals output by the RF down-converter DC, then to adjust its (voltage) gain according to control signals in order to adjust the level of the filtered analog signals, and to convert the filtered analog signals (with adjusted level) into digital signals, and
- a baseband processor module BBP arranged to process the digital signals (output by the adjuster AD) to output baseband signals.

It is important to notice that the receiver Rx may be adapted to process RF signals comprising I and Q modulated signals. In this case it comprises an I/Q demodulation module, intercalated between its RF down converter DC and its adjuster AD, and arranged to demodulate the received and amplified RF signals in order to separately output I modulated analog signals and Q modulated analog signals whose level may be adjusted (separately and in parallel) by the adjuster AD. Instead of carrying out the level adjustment after the RF down converter DC, it is also possible to carry it out on the low-noise amplifier LNA.

Figure 2:
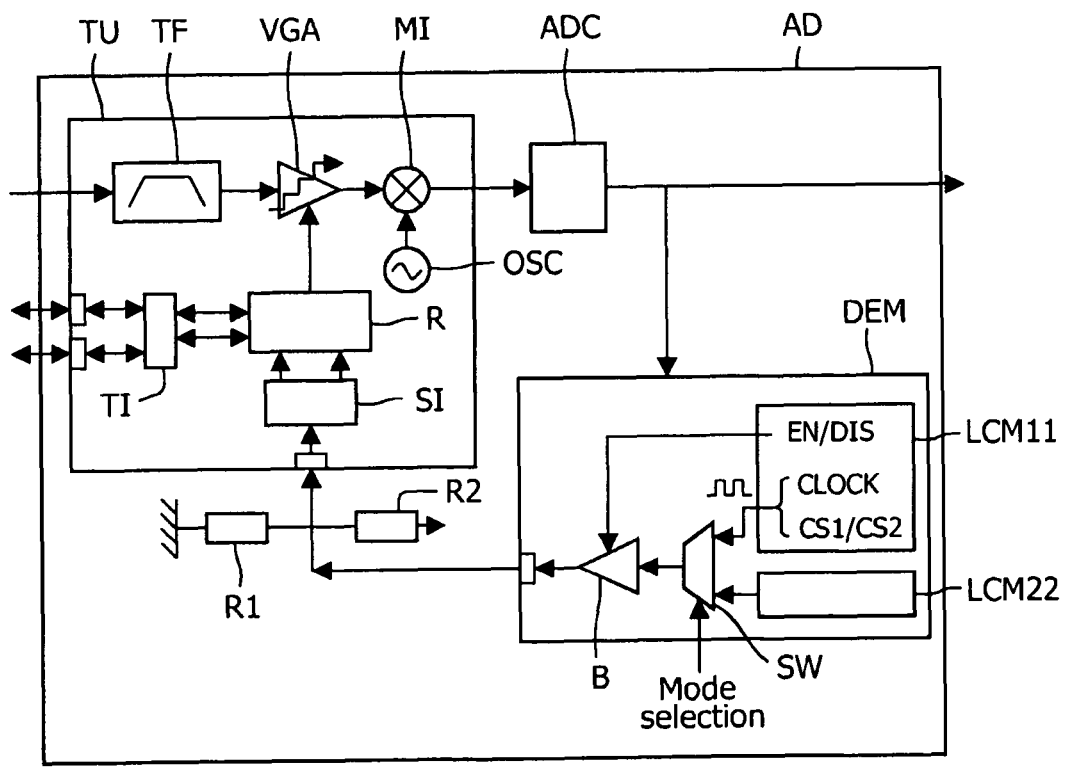

The adjuster AD comprises a tuner TU arranged to adjust its gain according to control signals, in order to adjust the level of the analog signals it receives, and a demodulator DEM arranged to generate the control signals from (secondary) signals representative of the adjusted signals output by the tuner TU. Such an adjuster AD is illustrated in FIG. 2.

In the example shown, the adjuster AD comprises an analog-to-digital converter ADC arranged to convert the analog signals with a chosen level (received from the tuner TU) into digital signals ready to be processed by the baseband processor module BBP. The secondary signals, used by the demodulator DEM to generate the control signals, are the digital signals output by the analog-to-digital converter ADC.

Figure 3:
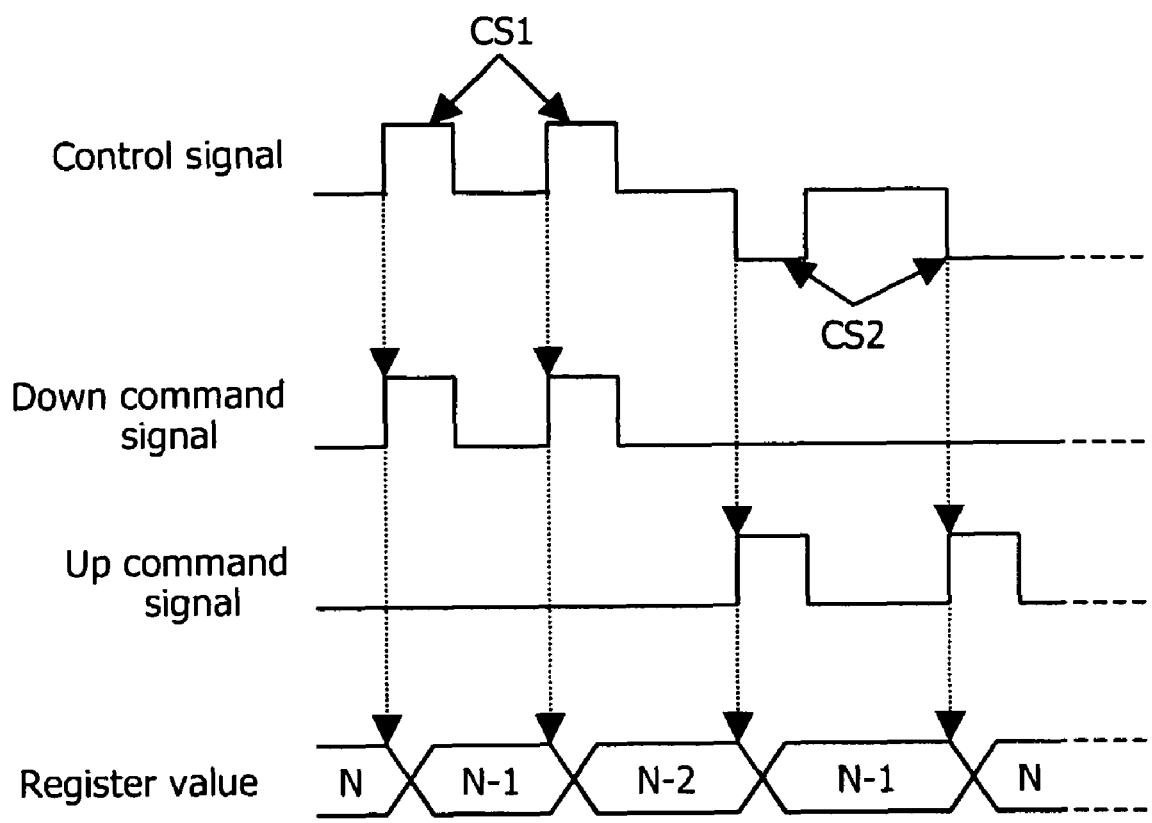

According to the invention the demodulator DEM comprises a level control module LCM1 arranged to generate a first CS1 or second CS2 digital control signal respectively when it detects an increase or decrease respectively of the level of the secondary signals at the output of the analog-to-digital converter ADC (see FIG. 3). In other words, the level control module LCM1 analyzes the value of each output digital signal and each time it detects a level variation between two successive digital signals it generates either a first digital control signal CS1, when the level variation corresponds to an increase, or a second digital control signal CS2, when the level variation corresponds to a decrease.

It is important to notice that the level control module LCM1 may be arranged to generate a first CS1 or second CS2 digital control signal if the amplitude of the level variation is greater than a chosen threshold in order to avoid ceaseless gain adjustments by the tuner TU.

Moreover it may be noticed that according to the invention a digital control signal is not representative of the corresponding detected level variation amplitude. Therefore, a first CS1 or second CS2 control signal is only intended for informing the tuner TU that it has to increase or decrease its gain to compensate the detected level variation at least partly. So a digital control signal may be a very simple signal having a first value CS1 corresponding to a zero (0) voltage, for instance, and a second value CS2 corresponding to a voltage Vcc, for instance. Such a digital control signal may be transmitted to the tuner TU through the classical AGC voltage line (defined between the demodulator DEM and the tuner TU).

The solution according to the invention differs radically from the one implemented in the state of the art adjuster in which the control signals are digital pulse streams, named PWM (Pulse Width modulation), and which need to be converted into analog signals in order to be interpretable by the tuner.

As is illustrated in FIG. 2, the level control module LCM1 comprises a first output intended for delivering an enable/ disable signal (0/1) and a second output intended for delivering the first CS1 and second CS2 control signals synchronized with a clock. These first and second outputs are connected to first and second inputs of a tri-state buffer B respectively. This buffer B is arranged to be placed into one of its three states (0, 1, high impedance) depending on the values on its inputs. For instance, when the enable/disable signal value is equal to 0 the buffer B has a high output impedance (Vcc), and when the enable/disable signal value is equal to 1 the buffer B outputs the first CS1 or second CS2 control signal generated by the level control module LCM1.

Still according to the invention the tuner TU comprises a gain control module (SI and R), to make use of the digital control signals generated by the demodulator DEM, and a gain adjusting module VGA to adjust the gain according to the commands defined by the gain control module SI and R.

More precisely, the gain control module SI and R is arranged to define a first (or "Down") or second (or "Up") digital command signal respectively when it receives a first CS1 or second CS2 digital control signal respectively from the demodulator DEM. In other words, each time the gain control module SI and R receives a signal which corresponds to a first CS1 or second CS2 digital control signal it defines a first ("Down") or second ("Up") digital command signal.

The gain adjusting module VGA is arranged to decrease or increase respectively its gain by a fixed value when the command signal defined by the gain control module SI and R is a first or second command signal respectively. In other words, each time the gain control module SI and R defines a first ("Down") or second ("Up") digital command signal, the gain adjusting module VGA decreases or increases its current gain value by an increment or a decrement equal to the fixed value.

It is important to notice that the fixed gain value that is added to or subtracted from a current gain value by the gain adjuster module VGA, is not generally exactly equal to the gain variation that is necessary to compensate the detected level variation. This results from the fact that a digital control signal is intended for informing the tuner TU that it has to increase or decrease its gain by the fixed value, but not for informing the tuner TU of the amplitude of the detected level variation. Therefore, several successive gain adjustments (corresponding to several successive digital control signals) may be necessary for the adjuster AD to finely compensate a detected level variation.

As is illustrated in FIG. 2, the gain adjusting module VGA may be preceded by an RF tracking filter TF and possibly followed by a mixer MI driven by an oscillator OSC arranged to convert the frequency of the signals (output by the gain adjusting module VGA) into another intermediate frequency.

For instance and as illustrated in FIG. 2, the gain control module may comprise a signal interface SI and a register R. More precisely, the signal interface SI is a process module intended for generating a first or second register command (which are the first ("Down") or second ("Up") digital command signal respectively), when it receives a first CS1 or second CS2 digital control signal respectively from the demodulator DEM. In other words, each time the signal interface SI detects a first CS1 or second CS2 digital control signal on its input (which corresponds for instance to a zero voltage or a Vcc voltage), it defines a first ("Down") or second ("Up") digital command signal.

The register R is a kind of up/down counter intended for storing an n-bit word, whose current value constitutes a command signal, and for decreasing or increasing respectively the value of this word by a chosen increment (representative of the gain fixed value) when it receives a first ("Down") or second ("Up") register command respectively from the signal interface SI. In other words, when the register R receives a first ("Down") digital command signal it decrements the word value it stores from a chosen decrement which is representative of the gain fixed value, and when the register R receives a second ("Up") digital command signal it increments the word value it stores from a chosen increment which is representative of the gain fixed value. For instance, if the current stored value of the n-bit word is equal to N and if the register R receives a first ("Down") digital command signal, the new stored value becomes equal to N−1, and if the current stored value of the n-bit word is equal to N and if the register R receives a second ("Up") digital command signal, the new stored value becomes equal to N+1.

It may be noticed that it is not mandatory for the register increment or decrement to be equal to 1.

The number n of bits defining the word may be equal to 8. But, it may be equal to any other integer value. This bit number n depends on the gain accuracy of the tuner TU.

In this example, the gain adjusting module VGA is arranged to read the value of the word, which is stored in the register R and to set its gain accordingly. For instance, if the current gain value corresponds to a word value equal to N, and if the gain adjuster module VGA writes a new word value into the register R (for instance equal to N−1), then it adjusts (decreases) its gain so that its value corresponds to a word value equal to N−1. Now, if the current gain value corresponds to a word value equal to N, and if the gain adjusting module VGA writes a new word value into the register R (for instance equal to N+1), then it adjusts (increases) its gain so that its value corresponds to a word value equal to N+1.

In the example shown of adjuster AD two links are defined between the signal interface SI and the register R: the first one is used to transmit the clock signal, while the second one is used to transmit the register commands (up and down digital command signals).

An example of a sequence of four successive control signals is schematically illustrated in the first (upper) part of FIG. 3. In this example the demodulator DEM generates two successive first control signals CS1 and then two successive second control signals CS2.

In response to the first first control signal CS1, the signal interface SI generates a first down command signal which induces a decrease of the current word value stored in the register R (N→N−1). When the gain adjuster module VGA reads the new word value (N−1) stored in the register R, it adjusts (decreases) its gain in order for its value to correspond to a word value equal to N−1.

In response to the second first control signal CS1, the signal interface SI generates a second down command signal which induces a decrease of the current word value stored in the register R (N−1→N−2). When the gain adjuster module VGA reads the new word value (N−2) stored in the register R, it adjusts (decreases) its gain in order for its value to correspond to a word value equal to N−2.

In response to the first second control signal CS2, the signal interface SI generates a first up command signal which induces an increase of the current word value stored in the register R (N−2→N−1). When the gain adjuster module VGA reads the new word value (N−1) stored in the register R, it adjusts (increases) its gain in order for its value to correspond to a word value equal to N−1.

And finally, in response to the second second control signal CS2, the signal interface SI generates a second up command signal which induces an increase of the current word value stored in the register R (N−1→N). When the gain adjuster module VGA reads the new word value (N) stored in the register R, it adjusts (increases) its gain in order for its value to correspond to a word value equal to N.

The gain adjuster module VGA may be a variable gain amplifier or a variable gain attenuator, or the like.

As is illustrated in FIG. 2, the adjuster AD may also comprise an impedance means for defining a fixed high impedance value at the input of its gain control module SI and R (here at the input of the signal interface SI). For instance, this impedance means may comprise two identical resistors R1 and R2 mounted in parallel and defining an impedance equal to Vcc/2 when the buffer B has a high impedance output equal to Vcc.

Thus, when the gain control modules SI and R (here the signal interface SI) detects an impedance value equal to the fixed high impedance value (here Vcc/2), it stops defining command controls (this third state (Vcc/2) is interpreted by the gain adjuster module VGA has a state in which it has to do nothing). In the described (but non-limiting) example, as the signal interface SI no longer generates a command signal, the word value stored in the register R remains constant. Therefore, when the gain adjuster module VGA reads the word value it sees that it is unchanged and then keeps its gain value constant.

As is illustrated in FIG. 2, the gain control module (SI and R) may also comprise a working control module TI (here coupled to the register R), acting as a test interface and/or a control bus. This working control module TI may be intended for forcing the register R to store a chosen value in order to test the working of the adjuster AD and/or for reading the value of the word, which is stored in the register R in order to control the working of the adjuster AD.

The demodulator DEM may be arranged to selectively work either according to the invention (i.e. by transmitting first CS1 and second CS2 control signals to the tuner TU through the AGC voltage line) or according to the conventional mode (i.e. by transmitting PWM (Pulse Width Modulation) control signals to the tuner TU through the AGC voltage line). For this purpose, and as is illustrated in FIG. 2, the demodulator DEM not only comprises the level control module LCM1 but also another level control module LCM2 and a switch SW driven by a command referenced "mode selection".

The second level control module LCM2 may be, for instance, a conventional sigma-delta PWM module, which is well known by the man skilled in the art.

The second output of the first level control module LCM1 and the output of the second level control module LCM2 are connected to the switch SW, which delivers on its output either the first CS1 and second CS2 control signals or the PWM signals, depending on the command value corresponding to the selected mode.

In this case, and as illustrated in FIG. 2, one of the two inputs of the buffer B is connected the output of the switch SW and its other input is connected to the (first) enable/disable output of the first level control module LCM1. For instance, when the enable/disable signal value is equal to 0, the gain control module (SI and R) sees the chosen high impedance value (Vcc/2) on its input, and when the enable/disable signal value is equal to 1, the buffer B outputs the control signals generated by the first LCM1 or second LCM2 level control module, depending on the command value corresponding to the selected mode.

Preferably, the signal level adjusting device (or adjuster) AD, according to the invention, constitutes at least a part of an integrated circuit (IC) which may be realized in CMOS technology or in any technology used in tuner chip manufacturing, such as the BICMOS technology or the bipolar technology, for instance.

The invention is not limited to the embodiments of signal level adjuster, receiver circuit, transceiver and RF communication equipment described above, only as examples, but it encompasses all alternative embodiments which may be considered by one skilled in the art to be within the scope of the claims hereafter.

The invention claimed is:

1. A signal level adjusting device, for RF communication equipment arranged to received primary RF signals, said device comprising:
 a tuner arranged to adjust its gain according to control signals in order to adjust the level of said received primary RF signals;
 a demodulator arranged to generate said control signals from secondary signals representative of the adjusted signals output by the tuner and to include a level control circuit arranged to generate a first or second digital control signal respectively each time the demodulator detects a increase or decrease respectively of the level of said secondary signals,
 wherein the tuner includes i) a gain control circuit arranged in relation to a first or a second digital command signal to generate one of the first or second digital command signals respectively each time the tuner receives a first or second digital control signal respectively from said demodulator, and ii) a gain adjusting circuit arranged to decrease or increase the gain of the tuner by a fixed value respectively in response to circuit the first or second command signal; and
 an impedance circuit arranged to define a fixed high impedance value at an input of said gain control circuit, and in that said gain control circuit is arranged to stop defining a command control when an impedance value at an input of the gain control circuit is equal to said fixed high impedance value.

2. The signal level adjusting device according to claim 1, characterized in that said impedance circuit includes two identical resistors mounted in parallel.

3. A signal level adjusting device, for RF communication equipment arranged to received primary RF signals, said device comprising:
 a tuner arranged to adjust its gain according to control signals in order to adjust the level of said received primary RF signals;
 a demodulator arranged to generate said control signals from secondary signals representative of the adjusted signals output by the tuner and to include a level control circuit arranged to generate a first or second digital control signal respectively each time the demodulator detects a increase or decrease respectively of the level of said secondary signals,
 wherein the tuner includes i) a gain control circuit arranged in relation to a first or a second digital command signal to generate one of the first or second digital command signals respectively each time the tuner receives a first or second digital control signal respectively from said demodulator, and ii) a gain adjusting circuit arranged to decrease or increase the gain of the tuner by a fixed value respectively in response to circuit the first or second command signal; and
 the signal level adjust device includes a multi-state buffer having a first and a second input and one output coupled to the input of said gain control means, and in that the level control circuit has a first output configured and arranged to deliver enable or disable signals and a second output configured and arranged to deliver the first and second control signals synchronized with a clock, the first and second outputs of the level control circuit being respectively coupled to the first and second buffer inputs, and the buffer output either leaving an impedance value at an input of the gain control circuit at a chosen high impedance value in response to said first output of said level control module delivering a first enable or disable value, or delivering the first or second control signal in response to the first output of the level control module delivering a second enable or disable value.

4. A signal level adjusting device, for RF communication equipment arranged to received primary RF signals, said device comprising:

a tuner arranged to adjust its gain according to control signals in order to adjust the level of said received primary RF signals;

a demodulator arranged to generate said control signals from secondary signals representative of the adjusted signals output by the tuner and to include a level control circuit arranged to generate a first or second digital control signal respectively each time the demodulator detects a increase or decrease respectively of the level of said secondary signals, wherein the tuner includes i) a gain control circuit arranged in relation to a first or a second digital command signal to generate one of the first or second digital command signals respectively each time the tuner receives a first or second digital control signal respectively from said demodulator, and ii) a gain adjusting circuit arranged to decrease or increase the gain of the tuner by a fixed value respectively in response to circuit the first or second command signal; and wherein the gain control circuit includes i) a processing circuit arranged to generate a first or second register command respectively when it receives a first or second digital control signal respectively from said demodulator, and ii) a register adapted to store a n-bit word whose value constitutes said command signal, and to decrease or increase respectively, the value of said n-bit word by a chosen increment representative of said fixed value when it receives a first or second register command respectively said process circuit.

5. The signal level adjusting device according to claim 4, characterized in that said gain adjusting circuit is arranged to read the value of the word stored in said register and to set its gain depending on this value.

6. The signal level adjusting device according to claim 4, characterized in that said gain control circuit includes a working control circuit coupled to said register and arranged to force said register to store a chosen word value for test purposes and/or to read the value of the word stored in said register for control purposes.

* * * * *